United States Patent [19]

Benesch

[11] Patent Number: 4,990,877
[45] Date of Patent: Feb. 5, 1991

[54] PASSIVE SHIMMING ASSEMBLY FOR MR MAGNET

[75] Inventor: Jay F. Benesch, Gaithersburg, Md.

[73] Assignee: General Electric Company, Schenectady, N.Y.

[21] Appl. No.: 445,303

[22] Filed: Dec. 4, 1989

[51] Int. Cl.$^5$ .............................................. H01F 7/00
[52] U.S. Cl. .................................... 335/301; 324/318
[58] Field of Search .............. 335/301, 214, 211, 304; 324/318, 319, 320

[56] References Cited

U.S. PATENT DOCUMENTS 4,893,083 1/1990 Overweg et al. .................. 335/301

Primary Examiner—George Harris
Attorney, Agent, or Firm—Paul R. Webb, II; James C. Davis, Jr.

[57] ABSTRACT

A passive shim assembly for a magnet having a central bore is provided. The passive shim assembly includes a plurality of axially extending guide rails bonded directly to the bore of the magnet and equally spaced circumferentially. A plurality of arcuately shaped drawers are slidably mounted between adjacent channel pieces. A plurality of stacks of arcuate strips of magnetic flux conducting material demountably secured to each of the drawers, the strips extending in the circumferential direction.

4 Claims, 2 Drawing Sheets

PASSIVE SHIMMING ASSEMBLY FOR MR MAGNET

CROSS REFERENCE TO RELATED APPLICATIONS

This application is related to copending application Ser. No. 445,260, entitled "Apparatus for Locating Passive Shim Guide Rails in MR Magnets" and assigned to the same assignee as the present invention.

BACKGROUND OF THE INVENTION

The present invention relates to creating highly uniform magnetic fields in magnets used for magnetic resonance imaging, by the use of passive shimming to improve magnetic field homogeneity.

To create a highly uniform magnetic field with an electromagnet or array of permanent magnets, it is necessary to build the magnets to a carefully specified shape, and to strive to minimize the deviations from the specified shape due to manufacturing variations. The resulting magnets, however, typically require field corrections to achieve the desired level of inhomogeneity, due to deviations of the magnet from the designs or due to the presence of ferromagnetic material in the vicinity of the magnet.

To improve field uniformity, correction coils are typically used. These coils are capable of creating different field shapes which can be superimposed on an inhomogeneous main magnetic field to perturb the main magnetic field in a manner which increases the overall field uniformity. Unfortunately, many sets of such coil are typically required. A state of the art magnetic resonance (MR) imaging magnet has between 10 and 20 independent sets of corrections coils, each with its own power supply to provide the correct current flow. Naturally, these coils add significantly to the cost and complexity of the magnet.

Passive shimming is currently used to correct large deviations in magnetic fields that cannot be corrected by the available correction coils alone. The passive shimming is accomplished by placing a piece of iron in an appropriate place outside the magnet. The desired level of field uniformity can then be achieved by the correction coils.

A passive shimming assembly must provide accurate and reproducible placement of the passive shims in the magnet to avoid difficulties in removing and returning shim carriers to exactly the same location, the assembly must be rigid and accurately referenced to the magnet cryostat. The radial thickness should have a small radial extent to take up as little as possible of the magnet bore space thereby leaving room for the radio frequency coils and patient table.

It is an object of the present invention to provide a passive shimming assembly for a magnetic resonance magnet which can achieve a level of field inhomogeneity required for magnetic resonance imaging, without the use of correction coils.

It is a further object of the present invention to provide a shimming assembly which when used with a superconducting magnet can be adjusted without de-energizing the magnet.

It is another object of the present invention to provide a rigid assembly for mounting and locating the shim carriers while reducing the radial intrusion of the assembly into the magnet bore.

SUMMARY OF THE INVENTION

In one aspect of the present invention a passive shim assembly for a magnet having a central bore is provided. The passive shim assembly includes a plurality of axially extending guide rails bonded directly to the bore of the magnet and equally spaced circumferentially. A plurality of arcuately shaped drawers are slidably mounted between adjacent channel pieces. A plurality of stacks of arcuate strips of magnetic flux conducting material demountably secured to each of the drawers, the strips extending in the circumferential direction.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with the accompanying drawing figures in which:

DETAILED DESCRIPTION OF THE INVENTION

Figure 1:
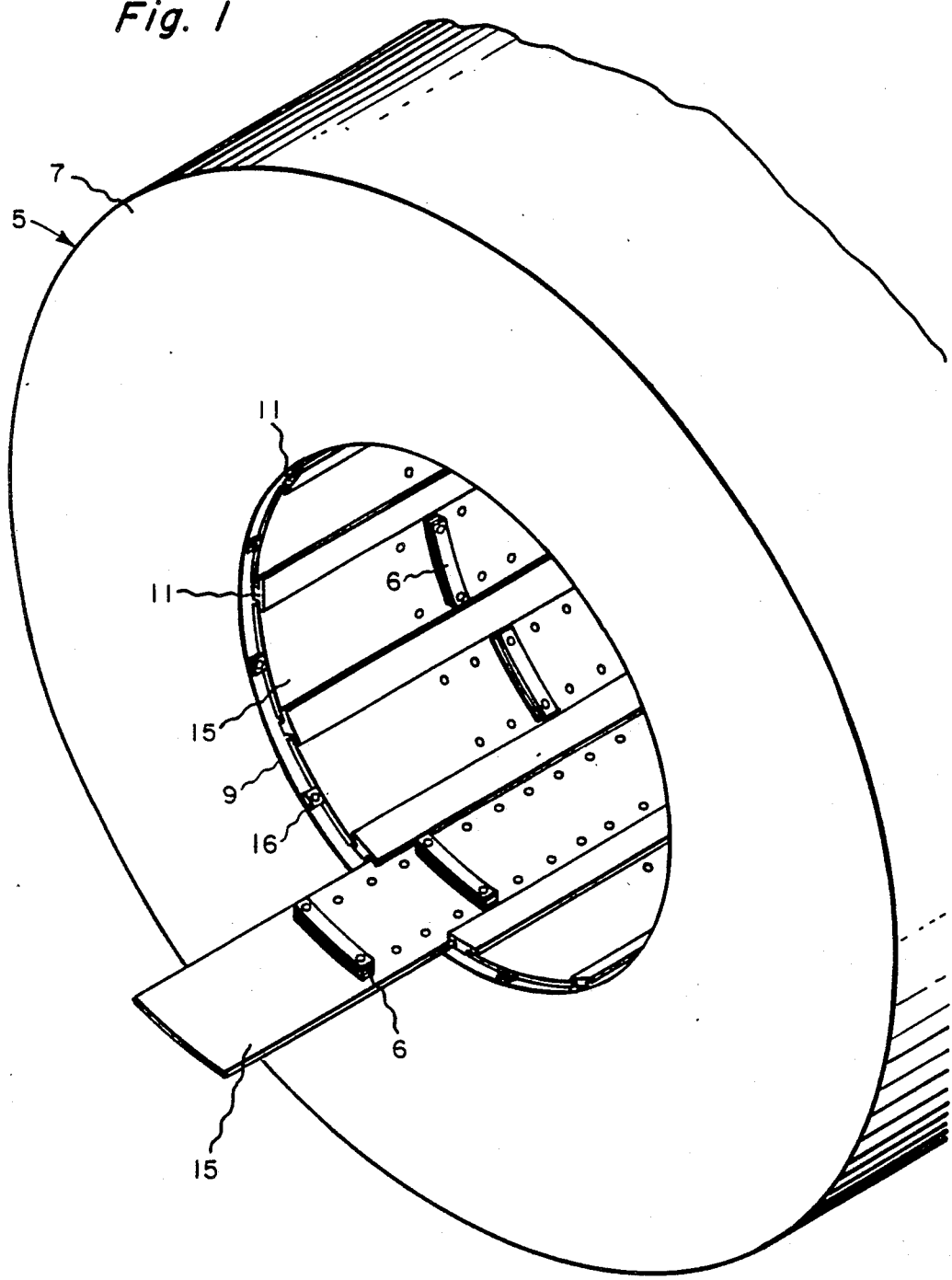
FIG. 1 is a partial isometric view of a cylindrical magnet with guide rails secured to the magnet bore holding shim drawers in accordance with the present invention.
Figure 2:
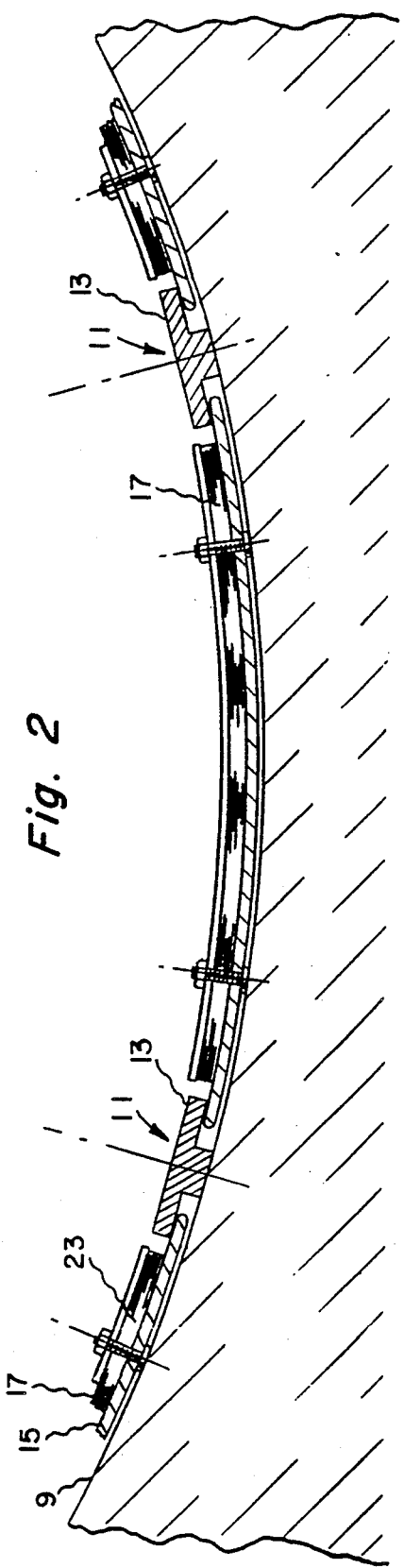
FIG. 2 is a partial sectional side view of FIG. 1.

Referring now to the drawing and particularly FIGS. 1 and 2 thereof, a cylindrical magnet 5 having a central bore is shown. In superconductive magnets, the windings are enclosed in a vacuum vessel. The inner cylinder which serves as the bore sleeve is typically 0.13–0.18 inches of stainless steel welded at either end to thicker carbon or stainless steel annular end plates. Guide rails 11 extend axially the length of the bore are equally circumferentially spaced about the interior of the bore and secured to the bore by adhesives or double sided foam tape either of which will conform to any irregularities in the guide rails or bore. The guide rails 11 each have two projecting edges 13 extending generally in the circumferential direction and extending axially coextensive with the rails. The edges are spaced away from the bore. The rails can be fabricated by machining reinforced plastic laminates or can be formed to final dimension as glass-epoxy or glass-polyester pultrusions. Alternatively, stainless steel rails can be used. Aluminum rails if used, may cause image artifacts when magnetic resonance imaging is performed. Apparatus for installing the shims are disclosed and claimed in copending application Ser. No. 445,260, hereby incorporated by reference.

Drawers 15 of the type shown in U.S. Pat. No. 4,698,611, are shown in FIGS. 1 and 2 of the present invention. U.S. Pat. No. 4,698,611 is hereby incorporated by reference. The drawers are arcuately shaped and extend substantially the axial length of the magnet bore. The drawers are slidable mounted between two adjacent rails with the projecting edges of the two adjacent rails preventing radial movement. The drawers are prevented from sliding once placed in the magnet by blocks 16 which are secured to the annular end plates.

The drawers can be fabricated by a number of different processes. The drawers can be pultruded from composite materials. Pultrusion is a process in which continuous filaments are drawn through an orifice which also meters out encapsulating resin such as a thermoplastic. The drawers can be fabricated from glass fibers and polycarbonate or glass fibers and polyetherimide. The drawers can alternatively be fabricated by machining a glass epoxy cylinder of the appropriate size.

Figure 3:
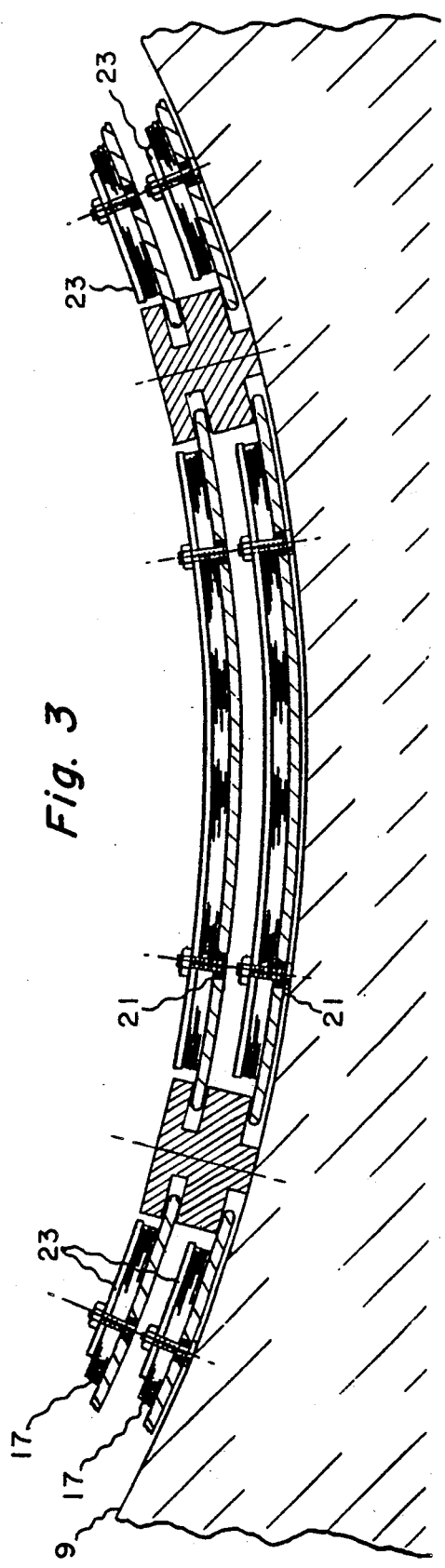
FIG. 3 is a partial sectional side view of a magnet having guide rails supporting two radially separated draw sets in accordance with another embodiment of the present invention.

Ferromagnetic strips 17 which provide the shimming are secured to predrilled holes 21 in the drawers 15. The ferromagnetic strips are arranged with their length extending in the circumferential direction. The shims are attached to the drawers using machine screws. The machine screws may screw into threaded inserts 21 previously installed in the drawers 15 as shown in FIG. 3. Alternatively, screws with knurled and bevelled heads for use in plastic may be hammered in predrilled round holes from the outside diameter of the drawer simplifying later installation of the shims.

The steel shims are constrained from moving in the radially inward direction under the effect of magnetic forces due to field gradients which contrary to intuition, may be directed radially inwardly by covers 23 at the top of each of the stacks The covers can be fabricated from a plastic laminate if the shim thickness is small or of any nonmagnetic alloy if the thickness and therefore the resultant magnetic forces is large. Stainless steel or other high resistivity metal covers are preferred for magnetic resonance imaging magnets since they reduce eddy currents effects. Aluminum covers of 0.06 inches thickness have been successfully used. The steel shims are located accurately by the tolerances of the preformed holes in the drawers. The tolerances of the drawer width, guide rail shape and thermal expansion coefficient of the drawers also effect shim position In 0.5 T magnets with large initial inhomogeneity. and in higher field magnets such as 1.0 or 2.0 T magnets, the magnetic forces on the passive shim drawers can become difficult for one person to hands. In FIG. 3, guide rails 25 accommodating two drawers, radially stacked are shown. The guide rails can be fabricated as previously described and are secured to the bore by adhesives or double sided foam tape. The guide rails each have two projecting edges as before extending axially the length of the bore equally circumferentially spaced about the interior of the bore, but the edges extend further in the radial direction and define two generally circumferentially extending notches at the same radial distance extending coextensively with the rails. One set of drawers can be used at the factory to shim the magnet. The second set of drawers would be in place but not contain any shims. At the installation site, the second set of drawers can be used to shim for any disturbance to the field caused by site specific conditions such as structural steel in the vicinity of the magnet. Typically the inhomogeneity at the customer site is less than 300 ppm. which does not require significant amounts of steel to shim. Initially homogeneities due to manufacturing tolerances are typically greater. If the drawers containing shims originally installed at the factory do not have to be removed to add additional shims but drawers not containing shims are used, the drawers can be more easily removed and replaced. In higher field or partially shielded magnets, the amount of steel required could be divided among two or more radially stacked drawers to reduce the force on each.

What is claimed is:

1. A passive shim assembly for a magnet having a central bore comprising:
    plurality of axially extending guide rails bonded directly to the bore of the magnet and equally spaced circumferentially;
    a plurality of arcuately shaped drawers slidably mounted between adjacent channel pieces; and
    a plurality of stacks of predetermined length arcuate strips of magnetic flux conducting material demountably secured to each of said drawers, said strips extending in the circumferential direction.

2. The shim assembly of claim 1 wherein said arcuate strips of magnetic flux conductive material comprises strips having different saturation magnetization, said strips with the lower saturation magnetization allowing fine tuning of the magnet field inhomogeneity with an easily handled shim size.

3. The shim assembly of claim 2, wherein said strips of magnetic flux conductive material comprises steel strips and nickel strips.

4. A passive shim assembly for a magnet having a central bore comprising:
    a plurality of arcuate shaped drawers;
    a plurality of axially extending guide rails for supporting two sets of drawers radially spaced apart from one another, said guide rails bonded directly to the bore of the magnet and equally spaced from one another circumferentially, said drawers slidably mounted between rails, with two drawers supported radially spaced apart between two rails; and
    a plurality of stacks of predetermined length arcuate strips of magnetic flux conducting material demountably secured to each of said drawers, said strips extending in the circumferential direction.

* * * * *